(12) United States Patent
Dale

(10) Patent No.: US 9,851,640 B2
(45) Date of Patent: Dec. 26, 2017

(54) METHOD OF CASTING

(75) Inventor: Andrew Mark Dale, London (GB)

(73) Assignee: Graphic IP Limited, Leek Wootton, Warwickshire (GB)

( * ) Notice: Subject to any disclaimer, the term of this patent is extended or adjusted under 35 U.S.C. 154(b) by 1053 days.

(21) Appl. No.: 13/878,996

(22) PCT Filed: Oct. 11, 2011

(86) PCT No.: PCT/GB2011/051956
§ 371 (c)(1),
(2), (4) Date: Jul. 3, 2013

(87) PCT Pub. No.: WO2012/049489
PCT Pub. Date: Apr. 19, 2012

(65) Prior Publication Data
US 2014/0147634 A1    May 29, 2014

(30) Foreign Application Priority Data

Oct. 11, 2010 (GB) .................................. 1017103.1

(51) Int. Cl.
| | | |
|---|---|---|
| *B23K 26/362* | (2014.01) | |
| *H01L 21/50* | (2006.01) | |
| *G03F 7/20* | (2006.01) | |
| *B28B 7/00* | (2006.01) | |
| *B28B 7/34* | (2006.01) | |
| *E04G 9/10* | (2006.01) | |
| *B28B 1/14* | (2006.01) | |
| *B82Y 10/00* | (2011.01) | |
| *B82Y 40/00* | (2011.01) | |
| *G03F 7/00* | (2006.01) | |

(52) U.S. Cl.
CPC .............. *G03F 7/20* (2013.01); *B23K 26/362* (2013.01); *B28B 1/14* (2013.01); *B28B 7/0064* (2013.01); *B28B 7/342* (2013.01); *B28B 7/346* (2013.01); *B28B 7/348* (2013.01); *B82Y 10/00* (2013.01); *B82Y 40/00* (2013.01); *E04G 9/10* (2013.01); *H01L 21/50* (2013.01); *G03F 7/0002* (2013.01); *G03F 7/0017* (2013.01); *Y10T 428/24479* (2015.01)

(58) Field of Classification Search
CPC ........... H01L 21/50; H01L 21/60; H05K 3/02; B23K 26/362; G03F 7/20; G03F 7/0002; G03F 7/0017; B82Y 40/00; B82Y 10/00; B28B 1/14; B28B 7/346; B28B 7/342; B28B 7/0064; B28B 7/348; E04G 9/10; Y10T 428/24479

USPC ........... 219/121.68, 121.69, 121.85; 438/123
See application file for complete search history.

(56) References Cited

U.S. PATENT DOCUMENTS

| | | | |
|---|---|---|---|
| 4,595,543 A | | 6/1986 | Williams |
| 4,667,521 A | | 5/1987 | Fuss et al. |
| 4,668,607 A | * | 5/1987 | Wojcik .................. G03F 7/2022 164/6 |
| 5,124,736 A | * | 6/1992 | Yamamoto ................ G03F 7/30 15/77 |
| 5,594,989 A | | 1/1997 | Greve |
| 2002/0018962 A1 | * | 2/2002 | Urano ..................... G03F 7/027 430/273.1 |
| 2002/0113334 A1 | | 8/2002 | Matsuoka et al. |
| 2003/0041541 A1 | | 3/2003 | Chan |
| 2003/0188649 A1 | * | 10/2003 | Hounshell ................ B41M 1/04 101/395 |
| 2004/0177782 A1 | * | 9/2004 | McCrea .................... B41C 1/00 101/453 |
| 2006/0039818 A1 | | 2/2006 | Tsai et al. |
| 2007/0172140 A1 | * | 7/2007 | Kokemohr ............... G06K 9/40 382/261 |
| 2011/0111347 A1 | * | 5/2011 | Lingier ................. B41C 1/1008 430/302 |

FOREIGN PATENT DOCUMENTS

| | | |
|---|---|---|
| AU | 706808 | 6/1999 |
| CH | 658879 A5 | 12/1986 |
| EP | 0196033 | 10/1986 |
| GB | 2019605 A | 10/1979 |
| IT | 1119979 B | 3/1986 |
| JP | 2003-202676 | 7/2003 |
| JP | 2004-317978 | 11/2004 |

OTHER PUBLICATIONS

Wikipedia, "Image Resolution", Nov. 13, 2009, https://web.archive.org/web/20091113005913/http://en.wikipedia.org/wiki/Image_resolution.*

International Search Report dated Mar. 28, 2012, issued in PCT Application No. PCT/GB2011/051956, filed Oct. 11, 2012.

* cited by examiner

*Primary Examiner* — Galen H Hauth
(74) *Attorney, Agent, or Firm* — Workman Nydegger

(57) ABSTRACT

A method of casting a product includes the steps of: creating a finished photopolymer mold; introducing liquid into the mold; hardening the liquid; and removing the photopolymer mold. A casting mold and a method of making a casting mold, are also disclosed.

13 Claims, No Drawings

METHOD OF CASTING

FIELD OF THE INVENTION

This invention relates to a method of casting material and a mould therefor.

BACKGROUND TO THE INVENTION

A problem with existing methods of producing effects and textures on the surface of cast liquids, for example concrete, is that the resolution of the resulting product is generally not of a level sufficient for fine detail or complicated designs to be sufficiently clear. Whilst the concrete might be able to produce a good level of resolution, the mould in which the concrete is cast is of poor resolution. Furthermore, the depth of the resulting design on the concrete may be insufficient for the design to be visible from a distance.

One method of casting concrete is to produce a mould from wood or other materials into which concrete is poured to produce a cast product.

A further of producing a surface effect in the concrete is to machine a surface effect in relief into the one of the surfaces of the mould and to pour the concrete into the mould. The resulting concrete product takes on the design of the relief surface effect. However, one limitation of such a process is that the quality and resolution of the surface effect is limited by the tool size and machining process.

Another method of producing a mould is to use an object as a pattern and to pour silicone or similar material over the product to produce a mould onto which concrete is poured. For example, an object with a 'snakeskin' surface has silicone poured over it to create a mould. The mould is then filled with concrete, reproducing the surface effects on the original object. However, a disadvantage of such a process is that the surface effect is limited to the size, quality and resolution of the original object.

Photopolymer plates are usually used in the printing industry as relief plates for flexographic printing, especially for printing on packaging. The plates are usually in the form of a flexible polymer sheet which hardens when exposed to light. The photopolymer plate has a mask layer onto which light, often in the form of a laser, is directed to create a negative of the image. The plate is then exposed to light to produce the image in relief on the plate. The areas of the plate that have not been exposed to light and un-hardened and are washed away using a solvent, leaving a flexible printing plate, which is hardened and finished prior to use. Methods of producing finished photopolymer plates are known from the printing industry.

EP0196033 (WOJCIK) discloses a method of making moulds that can be used for casting bronze plates, which involves the use of photopolymer plates. The method comprises forming a design on the photopolymer plates, onto which wax and sand are applied to create a mould, into which bronze is subsequently cast using a lost-wax process. The use of sand and wax makes the process time consuming and labour intensive, and reduces the likelihood of multiple castings appearing the same.

IT1119979B (POLLACK) discloses a method of forming three-dimensional objects using photopolymers but involves the use of a lost-wax process.

SUMMARY OF THE INVENTION

Accordingly, the present invention comprises a method of making a photopolymer mould comprising the steps of:

taking an image;
processing the image to create a pattern comprising tones and halftones; and
using a photopolymer plate to create a mould from the image,
wherein the relief depth varies over the area of the mould according to the level of linework, tones and half tones of the processed image.

In a further aspect, the present invention relates to a method of casting material comprising the steps of;
creating a finished photopolymer mould as per the method above;
introducing liquid into the finished mould;
hardening the liquid; and
removing the photopolymer mould.

The invention uses a 2-dimensional image to create a 3-dimensional mould, from which products can be cast.

The liquid is applied directly onto the photopolymer mould such that it spreads into the whole mould and air bubbles and/or spaces are removed. The flowability of the liquid is such that the liquid spreads, or can be spread, into the photopolymer mould to remove as many air pockets as practicable and/or possible. The hardening step may involve curing the liquid.

Because the casting occurs within the photopolymer mould itself the labour required in casting the material is significantly reduced compared to existing methods. Additionally, the risk of variations in subsequently produced items is reduced compared to the use of a lost-wax process wherein the wax and sand has to be positioned in exactly the same manner each time. Furthermore, a bespoke and repeatable design can be produced. Should the photopolymer mould become damaged during the process of casting, the use of laser imaging and manufacture of a second mould allows for an exact replacement to be constructed.

"Finished photopolymer mould" is intended to mean a photopolymer mould, or plate, that has been imaged, exposed, cured, washed, dried and finished. An unfinished photopolymer will not be suitable for use as a casting mould as the polymer is not hardened and set.

Resolutions of, for example, 1575 dots, or cells, per cm (4000 ppi or 6 µm per dot, or cell) or greater (up to and including 8000 ppi or 3 µm per dot) can be achieved using a laser imaging, enabling photopolymer moulds to be produced comprising high quality and high resolution images, which is a significant improvement over existing techniques. Clearly, the particles must be smaller than the mould resolution in order to obtain a good reproduction of the image in the material. A further advantage of this method is that the photopolymer mould may be flexible so as to be able to cast curved products that may be used for corners of buildings.

"Hardening" is intended to solidify the liquid material and may involve allowing the substance to set over time, for example as with concrete, or it may require the application of heat and/or chemicals or involve a different hardening process, for example exposure to radiation.

Once the liquid has been hardened, the photopolymer mould can be removed from the material. It may be desirable to then finish the material, for example, using paint or the like.

Advantageously, the photopolymer mould is treated with release agent prior to the introduction of the liquid. By treating the photopolymer mould with a release agent, the mould becomes easier to remove from the finished material.

Preferably, the photopolymer mould comprises linework, tones or half-tones, or a combination thereof. The design on the photopolymer mould may comprise surface effects and textures such as text and images that incorporate linework, tones and half-tones. The designs may be created by varying the depth within the photopolymer mould, thereby producing a 'shading' effect in the resulting product.

In one embodiment of the present invention, the finished product comprises a refractory material. It may be desirable to cast refractory materials from the photopolymer for use in fire-proofing. Alternatively, parts that engage, or 'must fit', can be cast with an improved level of precision when using a photopolymer mould, as an example, items for use in a kiln, or where a high level of dimensional accuracy is required for heat resistant products.

It is preferable that the finished product is subsequently used to cast a secondary material. Where a refractory material is produced using the mould, the refractory material may then be used to cast further products. In such a situation, the photopolymer mould will act as a master mould from which further moulds may be produced. The refractory material can be used for casting liquids that are at a higher temperature than the photopolymer and would therefore destroy it, for example glass and metals.

Were a refractory material is cast, the secondary material may be selected from a group comprising glass, metal and ceramics.

In an advantageous embodiment, the photopolymer mould is attached to a formwork prior to the introduction of the liquid. This allows the flexible photopolymer mould to be used in non-horizontal applications, for example for casting walls or stairs from concrete so that effects, wording, images and/or logos are cast into the resulting hardened concrete.

Preferably, the liquid is selected from a group comprising concrete; ceramics; glass; metal; gels; polymer; plaster; composites; and food stuffs. Such materials can be used to create images and/or designs on structures that can be used for cladding or for tactile indicators, for example concrete walls incorporating tactile indicators to lead one to a fire escape. Bespoke coving may be produced using plaster, which, because the photopolymer mould is reusable, can be reproduced as required. Where the mould may become damaged from repeated use, it may be replaced with an identical one due to the precision offered by the use of lasers and photopolymer moulds. It may be desirable to create high-resolution embossed icing for use on a cake. Furthermore, it may be desirable to create high-resolution designs on ceramic tiles, especially when used in combination with halftones The invention extends to a casting mould made in accordance with the above method. The mould may comprise a photopolymer, wherein the photopolymer comprises designs comprising linework and tonework, preferably in the form of halftones by way of recesses in the photopolymer such that the resulting material is provided with the effect of tonal variations. In order to create the appearance of 'tonal variation, or 'shading', in a finished product, the photopolymer layer comprises a series of recesses, or cells. When the cast and hardened material is removed from the mould and is viewed from a distance, areas of halftones will appear to have a different tone from areas of continuous tone, thereby given the material an aesthetic quality.

It is advantageous that the relief depth of the halftone cells, the halftone screen ruling and/or the halftone cell shape vary over the area of the mould. By varying the halftone relief depth, screen ruling and cell shape, different shadows can be produced in the resulting product that will provide various changes in the tonal effect. This may be especially advantageous where the product is large and the tonal variations viewed from a distance; for example, on the side of a structure such as a sports stadium. The shape of the halftone cells may comprise a company logo and by varying the depth and screen ruling a larger design can be created from the cells.

The relief and depth of the halftone cells allow the design in the overall product to create a 'smooth' tonal variation when viewed from a reasonable distance from the product. Therefore, where the design will be viewed from a significant distance away, it may be desirable for the halftone cells to comprise larger recesses than a product that is intended to be viewed close-up.

Advantageously, the method of making a casting mould further comprises the steps of:
exposing a photopolymer mould to a light source from a first side;
exposing the photopolymer mould to a light source from a second side;
washing away the un-hardened polymer;
drying the photopolymer; and
finishing the photopolymer,
wherein the photopolymer mould is exposed to the light source through a mask on at least one side, the mask comprising a filter to permit a variable intensity of light to pass through the filter across its surface, thereby varying the amount of light reaching different parts of the photopolymer.

By applying a mask, or screen, which may comprise a variable filter, such as a 'greyscale' filter, the intensity of light hitting different areas of the photopolymer can be varied in order to obtain varying depths of hardening in the photopolymer when using a single source of electromagnetic radiation. In doing this, whilst the exposure time remains the same across the whole of the photopolymer, the depth to which the hardening occurs is varied according to the level of transmittance of light through the filter.

Preferably, a filter is applied to both sides of the photopolymer mould. By providing a filter on the opposite side, the time taken to produce the mould can be reduced by hardening both sides simultaneously. Furthermore, where the photopolymer is of a sufficient thickness, one mould can be used for two different designs, one on each side, thereby reducing the overall cost per casting as the amount of wasted photopolymer is reduced.

DESCRIPTION OF AN EXEMPLARY EMBODIMENT

Once a design has been settled upon, it is processed using known techniques to generate a processed image optimised to produce a high resolution mould. During the processing, the image is converted into a pattern, which can be linework and dots of varying shapes and sizes so as to allow tone and halftones to be produced, thus producing a final image with degrees of 'shading' when viewed from a distance.

One particular method of processing the image involves the steps of:
Selecting a 2-dimensional colour image to be turned into a 3-dimensional relief pattern;
Creating different surface textures and effects by varying the line widths, colours and opacities;
Adjusting the input and output levels of the image histogram to alter the contrast and brightness levels of the image;
Changing the image to a greyscale image;
Inverting the image to produce a negative of the image; and Applying an appropriate halftone screen if the image contains tonework, for example, applying a halftone screen resolution of 120 lines per inch (2.54 centimeters).

It may be preferable to adjust the output levels from the full scale to a reduced scale by cropping one or both of the extremities of the scale and recalibrating the scale thereafter. For example, the output levels may be cropped from 0-255 to 20-255, with the latter then constituting 100% of the scale. This can assist with improving the quality of the mould created from the photopolymer.

Processing will depend upon the photopolymer used for a particular product. The major factors to be considered during the processing step are the wavelength of light to be used for the back and main exposures, the time for which the photopolymer is exposed to the wavelength, the shoulder angle, relief depth, line type, halftone cell shape, cell gain, halftone screen ruling (number of line and dots, or cells, per cm/inch) and screen angle. The image depth is 6.3 mm in one particular example.

Once the mould has been manufactured, it is then attached to a formwork using double sided adhesive tape. A concrete mix is then prepared containing the appropriate additives in order to obtain the desired flow characteristics and properties. The mould is sprayed with a release agent to assist with the later removal of the mould from the cured and hardened product. The concrete mix is poured into the mould, ensuring that the concrete flows into all of the areas of the mould, especially the halftone cells, and that air pockets are eliminated as far as possible and practicable. The concrete is then allowed to cure over time and, when sufficiently set, it is removed from the mould.

In a situation where a refractory material is used, the process is the same as outlined above substituting the refractory material for the concrete. When the product made from the refractory material has been cured and finished, it can then be used to cast glass, metal, ceramics and other 'hot' liquids or molten solids.

The introduction of a liquid into the mould is intended to incorporate a process of filling the mould with a solid and subsequently liquefying the solid, thereby allowing it to flow in the mould; the liquid is still 'introduced' into the mould.

Items may be placed in the photopolymer mould prior to the liquid being introduced so that the item becomes part of the finished product. It may be desirable to incorporate highly-visible or reflective portions, for example retroreflectors, or 'cats eyes'®, in a concrete wall for use in a car park. This allows a driver to more clearly identify an exit or other directions. Alternatively, precious, or semi-precious, stones may be incorporated into the material, for example in floors, walls, cladding panels or coving, possibly for use in homes or offices.

The products, especially concrete products may incorporate additives for self-cleaning, for example titanium dioxide. Alternatively, or in addition, anti-bacterial additives and/or anti-fungal additives, including mould resistance, may be incorporated into the material. Additionally, the product, especially concrete, may incorporate pigment to provide an end product having colour, or an aroma, or perfume, to provide the concrete with a scent.

As examples, the cast product may be for use in architectural designs, especially for use in bars, restaurants, exhibitions, retail spaces and advertising space. For example, a company logo and/or name may be cast into the concrete that forms the walls of a building. Alternatively, concrete cladding may be produced comprising a logo and/or name.

The photopolymer mould may be a negative image of the required design. Where the product is to be used to subsequently cast a further product, the photopolymer mould may be a positive of the further product and the direct product form the photopolymer mould will be a negative.

Other applications of the method disclosed herein include, but are not limited to:

concrete surfaces in underpasses, car-parks, bridges and ceilings;

concrete products for use in architectural services, building services, graphic design, interior and exterior design, advertising and landscaping.

The invention extends to the use of the method to create cast products which are subsequently printed upon in selected regions using flexography or pad printing to print specific areas with specific colours, wherein registration marks cast into the product are used to establish a datum and ensure registration of the printed image with the cast image.

Numerous other variations and modifications to the illustrated construction may occur to the reader familiar with the art without taking them outside the scope of the present invention. As an example, it may be desirable to destroy the mould from the finished material rather than mechanically removing it, for example by burning or dissolving the photopolymer.

Rather than being cast in the photopolymer mould, the refractory material may be applied to the mould, for example by applying a layer of the refractory material to the photopolymer mould, such that the mould can be used for casting liquids with a melting point higher than that of the photopolymer. By way of an example, the photopolymer mould may be coated with a layer of heat resistant material and subsequently used to cast liquids such as glass and metals.

The invention claimed is:

1. A method of making a photopolymer mould comprising the steps of:

processing an image to adjust at least one property of at least part of the image, wherein the at least one adjusted property is selected from a group comprising: brightness, contrast, line width, colour, and opacity;

using laser imaging on a photopolymer plate to create a mould from the image, said laser imaging selected to have a resolution of at least 4000 ppi (6 µm per dot); and creating said mould by varying the intensity of light hitting different areas of the photopolymer plate in order to produce varying depths of hardening;

wherein the photopolymer mould obtained has a relief depth which varies over at least part of the area of the mould in accordance with the properties of the image, wherein, in the step of processing an image, the image is converted into a pattern of one or both of linework and dots, so as to produce tones and halftones on the processed image, wherein, in the step of processing an image, the variation of depth across the area of the mould is dependent on the level of tones and halftones of the processed image, wherein the depth of said halftones, a screen ruling of said halftones, and a shape of said halftones are varied so that said photopolymer mould provides different shadows within a moulded product, thereby providing changes in a tonal effect, and wherein, in the step of processing an image, the image is converted into a greyscale image and the scale is reduced by cropping one of the extremities of the scale.

2. A method according to claim 1, wherein said laser imaging is selected to have a resolution of up to 8000 ppi (3 μm per dot).

3. A method according claim 1, wherein said laser imaging is selected to have a resolution greater than 8000 ppi (3 μm per dot).

4. A method according to claim 1, wherein said halftones are recesses within said photopolymer, and wherein a resulting material is provided with the effect of tonal variations.

5. A method according to claim 1, wherein in the step of processing the image, the image has line widths, colours and opacities that are varied so that said photopolymer mould further comprises surface effects and textures.

6. A method according to claim 1 wherein in the step of processing the image, the halftone screen resolution is 120 lines per inch (2.54 centimeters).

7. A method according to claim 1, wherein in the step of varying the intensity of light hitting different areas of the photopolymer plate, the method further comprises using one of a mask and a screen comprising a variable filter.

8. A method according to claim 7, wherein in the step of varying the intensity of light hitting different areas of the photopolymer plate, the method further comprises using a second variable filter located on a side of said photopolymer mould opposite said variable filter.

9. A method according to claim 7, wherein said variable filters comprise greyscale filters.

10. A method according to claims 7, wherein said variable filters are configured to vary the level of transmittance of light therethrough to vary the depth to which the hardening occurs.

11. A method according to claim 1, wherein in the step of processing the image, the image is inverted to create a negative of the original image.

12. A method according to claim 1, wherein said photopolymer mould comprises two different designs, whereby one of said designs is located on each side of said photopolymer mould.

13. A method according to claim 1, wherein in the step of creating said mould, the method further comprises the steps of:
- exposing the photopolymer mould to the laser imaging from a first side;
- exposing the photopolymer mould to the laser imaging from a second side;
- washing away the un-hardened polymer;
- drying the photopolymer; and
- finishing the photopolymer; and
- wherein the photopolymer mould is exposed to the laser imaging through a mask on at least one side, the mask comprising a filter to permit a variable intensity to pass through the filter across its surface, thereby varying the amount of light reaching different parts of the photopolymer plate.

* * * * *